(12) United States Patent
Phillips

(10) Patent No.: US 7,081,985 B2
(45) Date of Patent: Jul. 25, 2006

(54) OPTICAL WAVELENGTH SHIFTING

(75) Inventor: Christopher C. Phillips, London (GB)

(73) Assignee: Imperial College of Science, Technology and Medicine, London (GB)

(*) Notice: Subject to any disclaimer, the term of this patent is extended or adjusted under 35 U.S.C. 154(b) by 228 days.

(21) Appl. No.: 10/343,929

(22) PCT Filed: Jul. 27, 2001

(86) PCT No.: PCT/GB01/03394

§ 371 (c)(1),
(2), (4) Date: Jun. 11, 2003

(87) PCT Pub. No.: WO02/13344

PCT Pub. Date: Feb. 14, 2002

(65) Prior Publication Data

US 2005/0073740 A1    Apr. 7, 2005

(30) Foreign Application Priority Data

Aug. 7, 2000    (GB) .................................. 0019376

(51) Int. Cl.
*G02F 2/02* (2006.01)
*H01S 5/34* (2006.01)
(52) U.S. Cl. .................. 359/332; 359/326; 372/43
(58) Field of Classification Search ........ 359/326–332; 372/43
See application file for complete search history.

(56) References Cited

U.S. PATENT DOCUMENTS 5,739,949 A * 4/1998 Rosencher et al. ......... 359/332

FOREIGN PATENT DOCUMENTS

| EP | 0 517 532 | 12/1992 |
| FR | 2 740 271 | 4/1997 |
| FR | 2 784 514 | 4/2000 |

OTHER PUBLICATIONS

H.C. Chui et al, "Tunable Mid-Infrared Generation By Difference Frequency Mixing....In Intersubband InGaAs/AlAs Quantum Wells", Applied Physics Letters, vol. 66, No. 3, Jan. 16, 1995, pp. 265-267.*

P.S. Spencer et al, "Quantum Well Structures For Intersubband Semiconductor Lasers", International Journal of Optoelectronics, vol. 10, No. 5, 1995, pp. 393-400.*

(Continued)

*Primary Examiner*—John D. Lee
(74) *Attorney, Agent, or Firm*—Nixon & Vanderhye P.C.

(57) ABSTRACT

An apparatus (8, 14) for wavelength shifting light from a first frequency $v_1$ to a second frequency $v_2$ is provided in the form of a semiconductor intersubband laser (8) lasing at its intersubband frequency $v_3$. The output light is wavelength shifted to a frequency $v_2 = v_1 + nv_3$, where n is a non-zero integer ( ... , −2, −1, 1, 2, ... ). The wavelength shifted light $v_2$ may be amplitude modulated and/or frequency modulated to impart information upon it. The wavelength shifting is a coherent process allowing for the possibility of coherent communication techniques to be used.

25 Claims, 4 Drawing Sheets

OTHER PUBLICATIONS

A. Kastalsky, "Infrared Intraband Laser Induced in a Multiple-Quantum-Well Interband Laser" *IEEE Journal of Quantum Electronics,* vol. 29, No. 4, Apr. 1993, pp. 1112-1115.

C. Phillips et al, "Generation of First-Order Terahertz Optical Sidebands in Asymmetriccoupled Quantum Wells" *Applied Physics Letters,* vol. 75, No. 18, Nov. 1999, pp. 2728-2730.

D.S. George et al, "Wavelength Conversion Schemes Using Semiconductor Lasers" *International Journal of Optoelectronics,* 1995, vol. 10, No. 5, pp. 315-323.

\* cited by examiner

OPTICAL WAVELENGTH SHIFTING

This application is the US national phase of international application PCT/GB01/03394, filed in English on 27 Jul. 2001, which designated the US. PCT/GB01/03394 claims priority to GB Application No. 0019376.3 filed 7 Aug. 2000. The entire contents of these applications are incorporated herein by reference.

This invention relates to the field of optical devices. More particularly, this invention relates to an apparatus and method for changing the wavelength of light in a manner that can, for example, be useful in optical fiber systems.

It is known to provide semiconductor diode lasers as sources of laser light that are robust and inexpensive. Such semiconductor diode lasers typically operate using a transition between the valence and conduction bands within the semiconductor material. It is also known to provide quantum well semiconductor diode lasers in which the semiconductor material composition is carefully varied to yield a desired band gap in a manner that can tune the wavelength of the laser light produced.

More recently a class of semiconductor lasers have been developed that are termed quantum cascade lasers. An example of such a laser is described in the paper "Long wavelength infrared ($\lambda$=11 µm) quantum cascade lasers", C. Sirtori, et al. Applied Physics Letters 69 (19), 4 Nov. 1996, page 2810. These quantum cascade lasers operate using an intersubband transition within a quantum well structure. The device is arranged such that an electron undergoing a lasing transition in one quantum well can tunnel its way to an adjacent quantum well where it will be energetically at the correct level to undergo a further lasing transition. This cascade behavior allows the efficiency of the laser to be improved.

It is known from the paper "Generation of first-order terahertz optical sidebands in asymmetric coupled quantum wells", C Phillips et al, Applied Physics Letters 75(18), 1 Nov. 1999, page 2728 that a quantum well structure may be illuminated with light of two different wavelengths and sidebands induced spaced around one of the incident wavelengths. The system used in this experiment employed a Ti:Sapphire laser together with a free electron laser as the light sources. The size and complexity of these laser sources precludes their use as a practical way to shift the wavelength of light from an incident wavelength into a sideband wavelength.

There is a constant need to increase the data transmission capabilities of communication systems. The adoption of optical fiber communication systems has markedly increased available bandwidth. A problem in such optical fiber communication systems is the need to avoid changing a signal from an optical signal into an electrical signal more than is absolutely necessary. Electrical signal processing systems that are capable of keeping pace with an optical fiber communication systems are difficult to produce and expensive as well as representing a bottleneck in the transmission capabilities of the system.

A desired manipulation upon optical signals within an optical fiber communication system is wavelength shifting. Such wavelength shifting facilitates wavelength division multiplexing that can release more bandwidth from a given optical fiber link. However, wavelength shifting by receiving an optical signal and converting it into an electrical signal that triggers the production of a further optical signal at a different wavelength suffers from the disadvantage of having to change the signal from an optical form into an electrical form and then back into an optical form as discussed above.

Viewed from one aspect the present invention provides apparatus for transforming electromagnetic radiation at a first frequency $v_1$ to electromagnetic radiation at a second frequency $v_2$, said apparatus comprising:

a semiconductor intersubband laser operable to lase to generate electromagnetic radiation at a third frequency $v_3$; and a radiation guide operable to direct electromagnetic radiation at said first frequency $v_1$ into said semiconductor intersubband laser;

whereby, in operation, said electromagnetic radiation at said first frequency $v_1$ and said electromagnetic radiation at said third frequency $v_3$ undergo coherent frequency mixing within said semiconductor intersubband laser to generate said electromagnetic radiation of said second frequency $v_2$, $v_2$ being $v_1+nv_3$ with n being a non zero integer.

The present invention recognizes that a semiconductor intersubband laser is able to provide the electron energy level structure required to obtain wavelength shifting together with one of the electromagnetic radiation fields in the form of the laser light of that laser itself. Accordingly, the additional components needed for wavelength shifting are substantially only the incident electromagnetic radiation of the first frequency that can be passed into the semiconductor intersubband laser. This makes wavelength shifting a practical and economical possibility using what may be only a simple two-terminal device in the form of a semiconducter intersubband laser. The wavelength shifting occurs as an optical process without the need to convert into an electrical signal thereby avoiding the processing bottlenecks associated with conversions into electrical signals. The frequency mixing that occurs within the semiconducting intersubband laser is a coherent process and accordingly lends itself to coherent communication schemes. The wavelength shift induced ("channel separation") can be tuned by varying the intersubband gap using known quantum well techniques to suit the particular requirements. The wavelength can be both increased and decreased as n can be both positive and negative. It is also possible to modulate the sidebands using amplitude modulation or frequency modulation as an additional way of imparting information onto the optical signals.

It will be appreciated that the semiconductor intersubband laser could have various different forms. However, a quantum cascade laser is particularly well suited for this use in view of its high efficiency and the ability to engineer its photon energy.

A problem that reduces the intensity of the sideband radiation is it this may be absorbed within the semiconductor intersubband laser. The amount of wavelength shifted electromagnetic radiation emerging from the intersubband laser can be improved by using a mirror to reflect electromagnetic radiation back out of the semiconductor intersubband laser.

The mirror preferably abuts a face of the semiconductor intersubband laser and may have the form of a multilayer Bragg reflector upon which the semiconductor intersubband laser is formed (grown).

The radiation guide for directing the electromagnetic radiation of the first frequency into the semiconductor intersubband laser could take various different forms. A particularly well suited form is an optical fiber, although a suitable lens and free transmission arrangement would be possible.

If an optical fiber is used as the radiation guide, then this may be conveniently butt coupled to the semiconductor intersubband laser and used to collect the electromagnetic radiation at the second frequency as well as inject the electromagnetic radiation at the first frequency.

As previously mentioned, modulation may be applied to the semiconductor intersubband laser to modulate the wavelength shifted light both in amplitude (including simply on and off) and in frequency. The current flow through the semiconductor intersubband laser alters its refractive index which in turn alters the wavelength of the electromagnetic radiation of the third frequency and consequently also the wavelength of the electromagnetic radiation at the second frequency.

In the context of frequency modulation, it is desirable that the semiconductor intersubband laser should include a distributed feedback grating to constrain the third frequency to avoid this becoming unstable.

Whilst the system may operate over a considerable range of frequencies, preferred frequencies are ones in which the electromagnetic radiation of the first is frequency is near infrared radiation and the electromagnetic radiation of the third frequency is infrared radiation.

The efficiency of the wavelength shifting is strongly enhanced when the electromagnetic radiation of the first frequency and the electromagnetic radiation of the second frequency are both substantially resonant with electron transitions within the semiconductor intersubband laser.

As previously mentioned, the present invention is particularly useful in providing a multiplexer for use in wavelength division multiplexing systems or an amplitude or frequency modulator for optical signals.

Viewed from another aspect the invention provides a method of transforming electromagnetic radiation at a first frequency $v_1$ to electromagnetic radiation at a second frequency $v_2$, said method comprising the steps of:

generating electromagnetic radiation at a third frequency $v_3$ with a semiconductor intersubband laser; and directing electromagnetic radiation at said first frequency $v_1$ into said semiconductor intersubband laser;

whereby, in operation, said electromagnetic radiation at said first frequency $v_1$ and said electromagnetic radiation at said third frequency $v_3$ undergo coherent frequency mixing within said semiconductor intersubband laser to generate said electromagnetic radiation of said second frequency $v_2$, $v_2$ being $v_1+nv_3$ with n being a non zero integer.

Embodiments of the invention will now be described, by way of example only, with reference to the accompanying drawings in which:

FIG. 1 schematically illustrates the electron energy levels and transitions within a semiconductor intersubband laser;

FIG. 2 schematically illustrates the electron energy levels and transitions within a quantum cascade laser;

Figure 8:
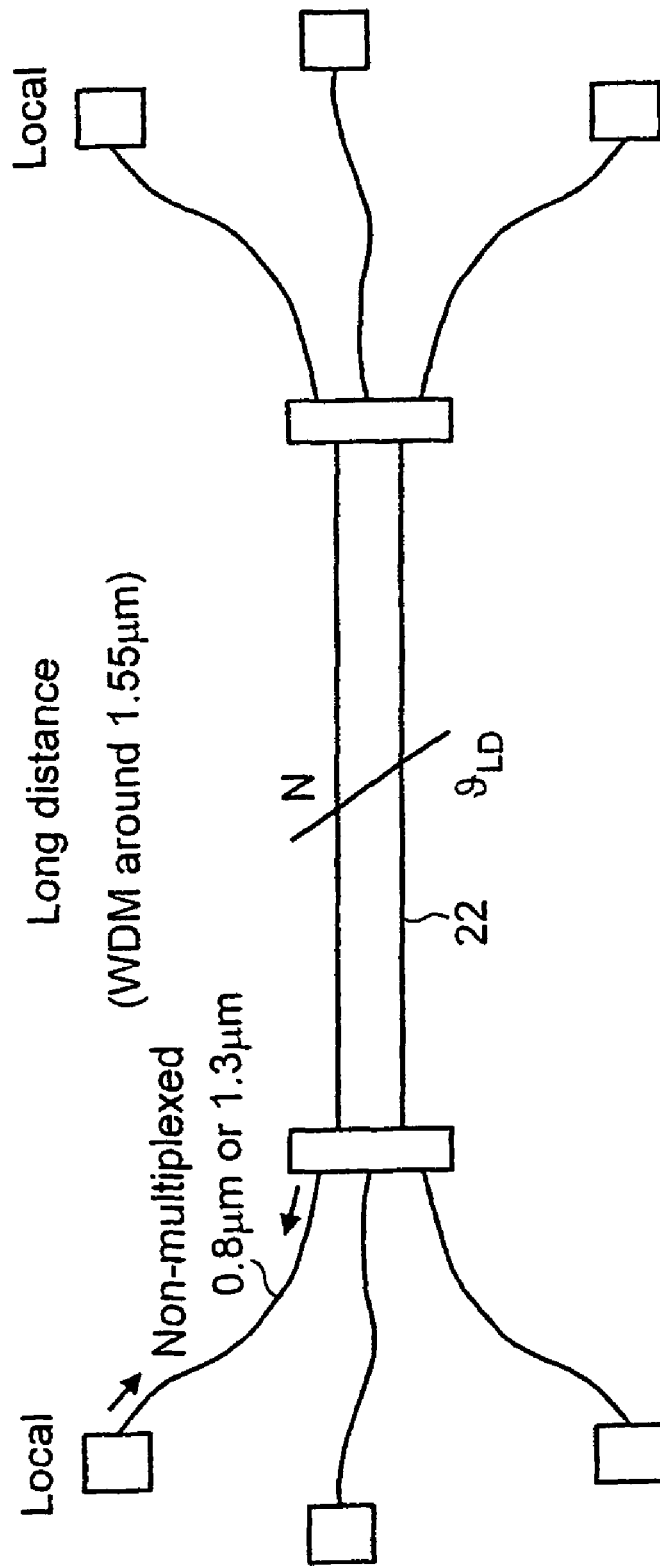

FIG. 8 schematically illustrates a wavelength division multiplexed optical communication system.

Figure 1:
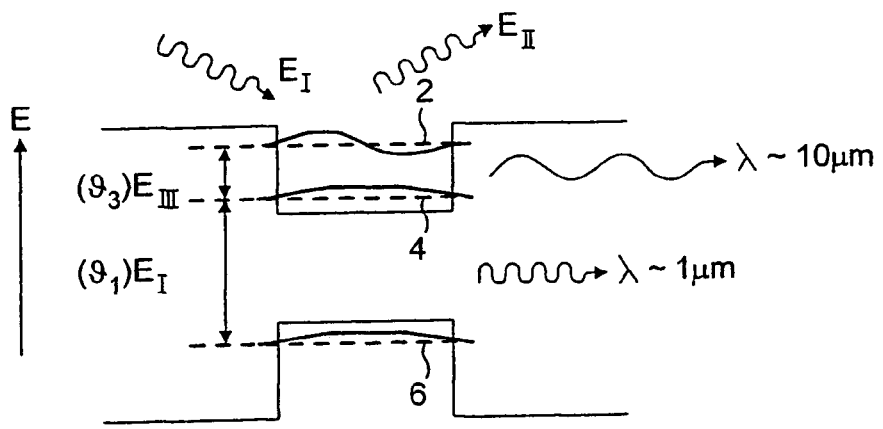

FIG. 1 shows the energy level structure within a semiconductor intersubband laser. Intersubband lasing transitions occur between the energy levels 2 and 4. These may typically yield output light of a wavelength of 10 µm. The energy difference between the energy levels 2 and 4 is $E_{III}$ which corresponds to photon frequencies of a third frequency $v_3$. In operation, when the semiconductor intersubband laser is electrically driven lasing occurs due to an electron transition from the energy level 2 to the energy level 4. In the normal way, reflective end faces of the laser result in electromagnetic radiation being trapped within the laser body for multiple passes and yielding a high intensity of electromagnetic radiation at the third frequency $v_3$.

The semiconductor intersubband laser also provides an electron energy transition from an energy level 6 within the valance band to the energy level 4 within the conduction band. This transition, of energy $E_I$, may typically be about ten times higher in energy than the intersubband transition and accordingly may have an associated wavelength of approximately 1 µm. This energy transition is not used during the normal operation of an intersubband laser. However, the present invention uses this transition to provide frequency mixing between input electromagnetic radiation of a first frequency tuned to this transition with an energy $E_I$ and the high intensity electromagnetic radiation of energy $E_{III}$ due to the lasing action described above. It will be seen that the semiconductor intersubband laser provides electron transitions resonant with both the incident electromagnetic radiation at an energy $E_I$ and the lasing electromagnetic radiation at an energy $E_{III}$. The result of the interaction within the semiconductor intersubband laser of these two frequencies of electromagnetic radiation and the electron energy level structure couples some energy into electromagnetic radiation sidebands at a second frequency $v_2$ corresponding to an energy $E_{II}$. This electromagnetic radiation may be at a variety of different sideband frequencies represented by $E_{II}=E_I+nE_{III}$, where n=...−2, −1, 1, 2.... The electromagnetic radiation at the second frequency $v_2$ and with the energy $E_{II}$ is wavelength shifted from the incident electromagnetic radiation at the first frequency $v$ and energy $E_I$. This wavelength shift is highly desirable and difficult to achieve in other ways. In particular, converting the input light into an electrical signal and then generating a new optical signal at a new wavelength is an alternative, but significantly less attractive, proposition. The output electromagnetic radiation with an energy $E_{II}$ is coherent with the input light giving the possibility for coherent communication systems and modulation techniques.

It will be appreciated that the efficiency with which light is moved into the sidebands will vary depending upon the particular circumstances and the degree of non-linear interaction that occurs. Whilst the absolute intensity of the wavelength shifted light may not be high, it is a comparatively simple matter to optically amplify this wavelength shifted light to a desired intensity. The number of sidebands produced will similarly vary depending upon the particular circumstances and way in which the system is driven. An individual sideband may be what is desired for a particular wavelength shift and this may be selected using appropriate filters. Alternatively, some modulation techniques may utilize all of the generated sidebands.

Figure 2:
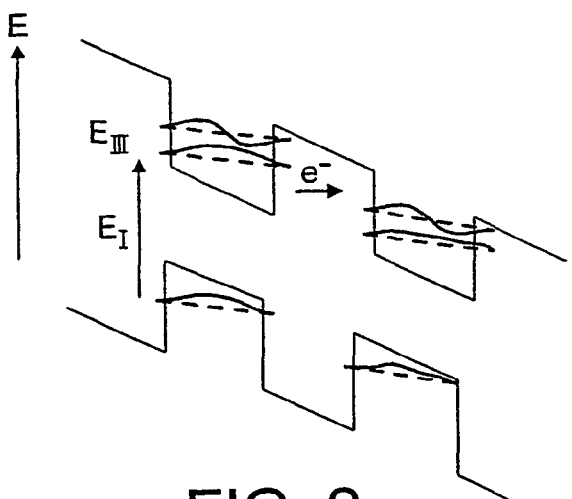

FIG. 2 illustrates a quantum cascade laser electron energy level structure. This quantum cascade laser can be seen to be a form of semiconductor intersubband laser in that it provides within each quantum well the structure illustrated in FIG. 1. However, when a given intersubband transition has occurred within the quantum cascade laser, the electron may tunnel into the adjacent well where a further transition may occur. This significantly increases the efficiency of the laser.

Figure 3:
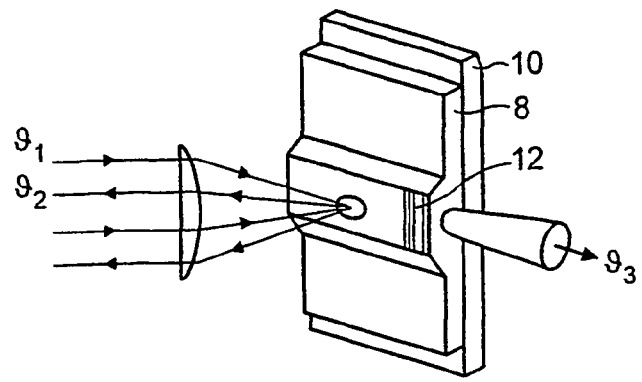
FIG. 3 illustrates a semiconductor intersubband laser operating as a wavelength shifting device.

FIG. 3 illustrates the physical appearance of a semiconductor intersubband laser 8. This semiconductor intersubband laser 8 is formed upon a Bragg mirror 10 comprising alternating layers of differing refractive index. A distributed feedback grating 12 is provided at one end of the laser 8 to lock the laser to a specific range of lasing frequencies.

In operation, the laser 8 is driven to lase at the third frequency $v_3$. Input light at the first frequency $v_1$ is directed into the laser 8 where it interacts with the lasing light at the third frequency $v_3$ to yield wavelength shifted light $v_2$ within sidebands of the incident light of the first frequency $v_1$. This wavelength shifted light $v_2$ is at one or more different frequencies that are integer multiple differences away from the input frequency $v_1$.

Figure 4A:
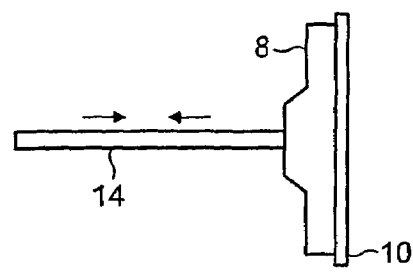
FIGS. 4A–4C illustrate three alternative ways in which light may be coupled in and out of a semiconductor intersubband laser.
Figure 4B:
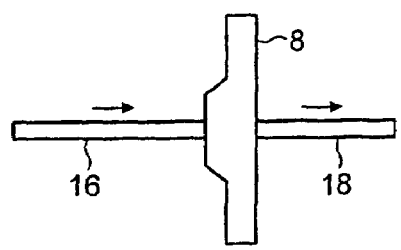
Figure 4C:
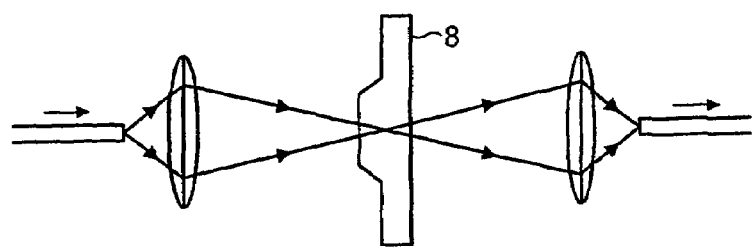

FIG. 4 illustrates three alternative ways in which the input light may be passed into the laser 8 and recovered from the laser 8. In the example A, an optical fiber 14 is butt coupled to the laser 8 and passes light into the laser 8 as well as collecting the wavelength shifted light from the laser 8 after it has been reflected from the Bragg mirror 10. In the example B, an optical fiber 16 passes the input light into the laser 8 and wavelength shifted light (as well as a considerable amount of the incident light) is collected out of the laser 8 by a second optical fiber 18. Example C illustrates input light being passed by free transmission into the laser 8 and collected on the opposite side. This uses a combination of optical fibers and lenses. It will be appreciated that other light injection and collection geometrys would be possible.

Figure 5:
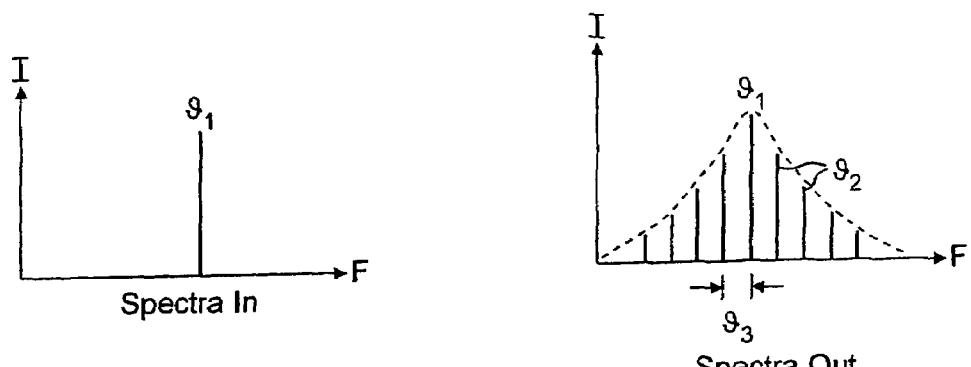
FIG. 5 illustrates input and output spectra.

FIG. 5 schematically illustrates the input and output spectra from the laser 8. The input light is the electromagnetic radiation of the first frequency $v_1$. The output light includes a dominant component at the input frequency $v_1$ together with various sideband components at wavelength shifted frequencies $v_2$. These wavelength shifted frequencies are spaced by integer multiples of the lasing frequency $v_3$ of the laser 8 away from the input frequency $v_1$. The distribution profile of the intensity of the sidebands will vary depending upon the particular driving conditions and other properties of the system.

Figure 6:
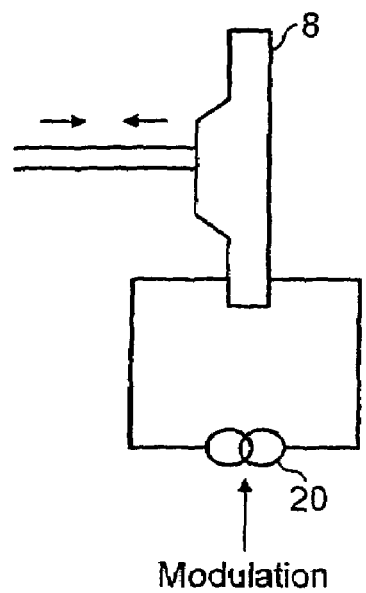
FIG. 6 illustrates modulation applied to the system.

FIG. 6 illustrates how the technique of the invention may be used to provide modulation of an optical signal. Whilst the laser 8 may be a simple two-terminal device connected to a current source 20, the current passed through the laser 8 may be modulated to provide modulation control. The modulation may simply switch on and off the lasing within the laser 8 in a manner that switches on and off the light within the sidebands. Alternatively, the light within the sidebands may be modulated in intensity between non-zero values by controlling the current through the laser to control the lasing light intensity between non-zero levels.

A further possibility is the use of frequency modulation of the sideband light. When the current through the laser 8 changes, the refractive index of the laser 8 changes. This change in refractive index effectively changes the cavity length of the laser 8 and so alters the wavelength of the laser light $v_3$. Changing $v_3$ also changes the frequencies of the sidebands. Accordingly, modulating the current through the laser 8 can impart a frequency modulation upon the sideband light $v_2$. In this circumstance a distributed feedback grating would not be used to lock the frequency $v_3$.

Figure 7:
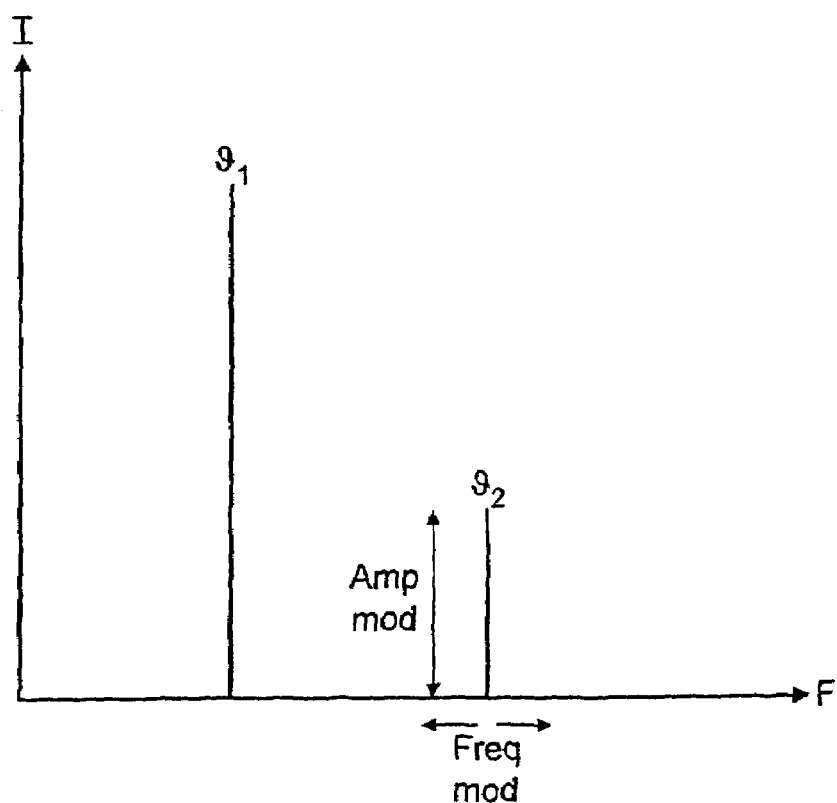
FIG. 7 illustrates the effects of modulation.

FIG. 7 illustrates the different types of modulation that can be applied to the sideband light at frequency $v_2$. Amplitude modulation, such as simple on/off modulation or amplitude intensity modulation between non-zero values may be provided. Alternatively, the frequency of the sideband light $v_2$ may be altered as described above to yield frequency modulation.

FIG. 8 schematically illustrates a simple optical communications system that may employ wavelength division multiplexing. The example uses a long distance portion 22 that is of a high capacity and uses light close to a frequency $v_{LD}$ (e.g. 1.55 µm) best suited for long distance propagation (e.g. low absorption and dispersion). As this long distance portion may be difficult and expensive to duplicate (e.g. an undersea cable), then one way of yielding more data bandwidth from it is to use wavelength division multiplexing into N channels around the frequency $v_{LD}$. The devices of the present invention may be used in the wavelength shifting needed to produce the wavelength divison multiplexing in the long distance portion.

In a local area, less capacity may be required and a more significant issue may be reducing the cost of the local system. Generally, equipment for transmitting and manipulating light signals is less expensive for light of a shorter wavelength (e.g. 0.8 µm or 1.3 µm). The light within the long distance portion may be separated into different channels using narrow line filters and then the devices of the present invention used to wavelength shift these separated signals to wavelengths more suited to the local transmission requirements. Whilst this wavelength shifting could be achieved by transforming the long distances light pulses into electrical signals and then using these electrical signals to generate optical pulses at the different wavelength, this process is fundamentally less attractive (e.g. inexpensive, flexible, ...) than one that takes place purely in the optical domain. Accordingly, the present invention provides the capability for wavelength shifting the optical pulses from a wavelength suited for long distance transmission to one wavelengths used for local transmission. The multiplexer can be thought of as serving to receive the input pulses at the input wavelength and then directing them into a different wavelength channel as optical pulses at that different wavelength. The wavelength shifted pulses may require amplification prior to transmission along their local path, but amplification may be relatively readily provided in the optical domain.

What is claimed is:

1. Apparatus for transforming electromagnetic radiation at a first frequency $v_1$ to electromagnetic radiation at a second frequency $v_2$, said apparatus comprising:
   a semiconductor intersubband laser for generating electromagnetic radiation at a third frequency $v_3$; and
   a radiation guide for directing electromagnetic radiation at said first frequency $v_1$ into said semiconductor intersubband laser, wherein said electromagnetic radiation at said first frequency $v_1$ and said electromagnetic radiation at said third frequency $v_3$ undergo coherent frequency mixing within said semiconductor intersubband laser to generate said electromagnetic radiation of said second frequency $v_2$, wherein $v_2$ equals $v_1 + nv_3$ where n is a non zero integer.

2. Apparatus as claimed in claim 1, wherein said semiconductor intersubband laser is a quantum cascade laser.

3. Apparatus as claimed in claim 1, further comprising a mirror operable to reflect electromagnetic radiation directed into said semiconductor intersubband laser by said radiation guide to pass out of said semiconductor intersubband laser.

4. Apparatus as claimed in claim 3, wherein said mirror abuts a face of said semiconductor intersubband laser.

5. Apparatus as claimed in claim 3, wherein said mirror is a distributed Bragg reflector.

6. Apparatus as claimed in claim 4, wherein said semiconductor intersubband laser is formed upon said mirror.

7. Apparatus as claimed in claim 1, wherein said radiation guide is an optical fiber.

8. Apparatus as claimed in claim 7, wherein said optical fiber is butt coupled to said semiconductor intersubband laser.

9. Apparatus as claimed in claim 1, wherein said electromagnetic radiation at said second frequency $v_2$ is output along said radiation guide.

10. Apparatus as claimed in claim 1, wherein said electromagnetic radiation at said first frequency $v_1$ is transmitted through said semiconductor intersubband laser to emerge mixed with said electromagnetic radiation at said second frequency $v_2$.

11. Apparatus as claimed in claim 1, further comprising a laser controller coupled to said semiconductor intersubband laser and operable to amplitude modulate said electromagnetic radiation at said third frequency $v_3$ so as to amplitude modulate said electromagnetic radiation at said second frequency $v_2$.

12. Apparatus as claimed in claim 11, wherein said laser controller amplitude modulates said electromagnetic radiation at said third frequency $v_3$ by controlling current flowing through said semiconductor intersubband laser.

13. Apparatus as claimed in claim 1, further comprising a laser controller coupled to said semiconductor intersubband laser and operable to frequency modulate said electromagnetic radiation at said third frequency $v_3$ so as to frequency modulate said electromagnetic radiation at said second frequency $v_2$.

14. Apparatus as claimed in claim 13, wherein said laser controller frequency modulates said electromagnetic radiation at said third frequency $v_3$ by controlling current flowing through said semiconductor intersubband laser to alter a refractive index of said semiconductor intersubband laser in a manner that alters said third frequency $v_3$.

15. Apparatus as claimed in claim 1, wherein said semiconductor intersubband laser includes a distributed feedback grating to constrain said third frequency $v_3$.

16. Apparatus as claimed in claim 1, wherein said electromagnetic radiation of said first frequency $v_1$ is near infrared radiation.

17. Apparatus as claimed in claim 1, wherein said electromagnetic radiation of said third frequency $v_3$ is infrared radiation.

18. Apparatus as claimed in claim 1, wherein said electromagnetic radiation at said first frequency $v_1$ and said electromagnetic radiation at said second frequency $v_2$ are both substantially resonant with electron transitions within said semiconductor intersubband laser.

19. A multiplexer for wavelength division multiplexing signals propagating along an optical fiber, said multiplexer including the apparatus of claim 1.

20. An amplitude modulator for amplitude modulating electromagnetic radiation, said amplitude modulator including the apparatus of claim 1.

21. A frequency modulator for frequency modulating electromagnetic radiation, said frequency modulator including the apparatus of claim 1.

22. A method of transforming electromagnetic radiation at a first frequency $v_1$ to electromagnetic radiation at a second frequency $v_2$, said method comprising the steps of:

generating electromagnetic radiation at a third frequency $v_3$ with a semiconductor intersubband laser; and directing electromagnetic radiation at said first frequency $v_1$ into said semiconductor intersubband laser, wherein, said electromagnetic radiation at said first frequency $v_1$ and said electromagnetic radiation at said third frequency $v_3$ undergo coherent frequency mixing within said semiconductor intersubband laser and generate said electromagnetic radiation of said second frequency $v_2$, wherein $v_2$ equals $v_1+nv_3$ where n is a non zero integer.

23. A method of wavelength division multiplexing signals propagating along an optical fiber, said method including the steps of claim 22.

24. A method of amplitude modulating electromagnetic radiation, said method including the steps of claim 22.

25. A method of frequency modulating electromagnetic radiation, said method including the steps of claim 22.

* * * * *